United States Patent
Rame et al.

(10) Patent No.: US 11,396,686 B2
(45) Date of Patent: Jul. 26, 2022

(54) NICKEL-BASED SUPERALLOY, SINGLE-CRYSTAL BLADE AND TURBOMACHINE

(71) Applicants: SAFRAN, Paris (FR); CENTRE NATIONAL DE LA RECHERCHE SCIENTIFIQUE, Paris (FR); UNIVERSITE DE POITIERS, Poitiers (FR); ECOLE NATIONALE SUPERIEURE DE MECANIQUE AEROTECHNIQUE, Futuroscope-Chasseneuil (FR)

(72) Inventors: Jérémy Rame, Moissy-Cramayel (FR); Jonathan Cormier, Chasseneuil du Poitou (FR)

(73) Assignees: SAFRAN, Paris (FR); CENTRE NATIONAL DE LA RECHERCHE SCIENTIFIQUE, Paris (FR); UNIVERSITE DE POITIERS, Poitiers (FR); ECOLE NATIONALE SUPERIEURE DE MECANIQUE AEROTECHNIQUE, Futuroscope-Chasseneuil (FR)

(*) Notice: Subject to any disclaimer, the term of this patent is extended or adjusted under 35 U.S.C. 154(b) by 81 days.

(21) Appl. No.: 17/059,656

(22) PCT Filed: Jun. 4, 2019

(86) PCT No.: PCT/FR2019/051319
§ 371 (c)(1),
(2) Date: Nov. 30, 2020

(87) PCT Pub. No.: WO2019/234345
PCT Pub. Date: Dec. 12, 2019

(65) Prior Publication Data
US 2021/0214822 A1 Jul. 15, 2021

(30) Foreign Application Priority Data
Jun. 4, 2018 (FR) .................................. 1854819

(51) Int. Cl.
*C22C 19/05* (2006.01)
*C30B 29/52* (2006.01)
*F01D 5/28* (2006.01)

(52) U.S. Cl.
CPC ............ *C22C 19/057* (2013.01); *C30B 29/52* (2013.01); *F01D 5/288* (2013.01); *F05D 2300/175* (2013.01); *F05D 2300/611* (2013.01)

(58) Field of Classification Search
CPC .................................. C22C 19/057; C22F 1/10
See application file for complete search history.

(56) References Cited

U.S. PATENT DOCUMENTS

| | | | |
|---|---|---|---|
| 5,270,123 A | 12/1993 | Walston et al. | |
| 5,366,695 A | 11/1994 | Erickson | |
| 5,888,451 A | 3/1999 | Konter et al. | |
| 2006/0093851 A1 | 5/2006 | Darolia et al. | |
| 2013/0129522 A1* | 5/2013 | Harris .................. | C22C 19/057 420/443 |
| 2018/0066340 A1 | 3/2018 | Reed et al. | |

FOREIGN PATENT DOCUMENTS

| | | |
|---|---|---|
| CN | 101220435 A | 7/2008 |
| CN | 105543568 A | 5/2016 |
| CN | 107960109 A | 4/2018 |
| GB | 2033925 A | 5/1980 |
| JP | H07268520 A | 10/1995 |
| JP | H11310839 A | 11/1999 |
| JP | 2008045176 A | 2/2008 |
| WO | WO 2018/078246 A1 | 5/2018 |
| WO | WO 2018/078269 A1 | 5/2018 |

OTHER PUBLICATIONS

Search Report dated Nov. 23, 2018, in FR Application No. 1854819 (2 pages).
International Search Report issued in International Application No. PCT/FR2019/051319 dated Oct. 17, 2019 (2 pages).
Abstract of Van Sluytman et al., A Pt-modified NI-base superalloy with High temperature precipitate stability, Materials Science and Engineering, vol. 639, pp. 747-754, May 2015.
Chinese Office Action in corresponding Chinese Application No. 2019800353860, dated Nov. 1, 2021 (14 pages).

* cited by examiner

*Primary Examiner* — Jessee R Roe
(74) *Attorney, Agent, or Firm* — Bookoff McAndrews, PLLC (57) ABSTRACT

The invention relates to a nickel-based superalloy comprising, in percentages by mass, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 4.30% platinum, 0 to 0.15% silicon, the remainder being nickel and unavoidable impurities. The invention also relates to a single-crystal blade comprising such an alloy and a turbomachine comprising such a blade.

19 Claims, 4 Drawing Sheets

NICKEL-BASED SUPERALLOY, SINGLE-CRYSTAL BLADE AND TURBOMACHINE

CROSS-REFERENCE TO RELATED APPLICATION(S)

This application is the U.S. national phase entry under 35 U.S.C. § 371 of International Application No. PCT/FR2019/051319, filed on Jun. 4, 2019, which claims priority to French Patent Application No. 1854819, filed on Jun. 4, 2018.

Technological Field

The present disclosure relates to nickel-based superalloys for gas turbines, in particular for stationary blades, also known as nozzles or rectifiers, or moving blades of a gas turbine, for example in the aerospace industry.

Technological Background

Nickel-based superalloys are known to be used in the manufacture of fixed or moving single-crystal gas turbine blades for aircraft and helicopter engines.

The main advantages of these materials are the combination of high creep strength at high temperatures and resistance to oxidation and corrosion.

Over time, nickel-based superalloys for single-crystal blades have undergone major changes in their chemical composition, with the aim in particular of improving their creep properties at high temperatures while maintaining resistance to the very aggressive environment in which these superalloys are used.

In addition, metallic coatings adapted to these alloys have been developed to increase their resistance to the aggressive environment in which these alloys are used, including oxidation resistance and corrosion resistance. In addition, a ceramic coating of low thermal conductivity, fulfilling a thermal barrier function, can be added to reduce the temperature at the surface of the metal.

Typically, a complete protection system consists of at least two layers.

The first layer, also called the sublayer or bond coat, is deposited directly on the nickel-based superalloy component to be protected, also known as the substrate, for example a blade. The deposition step is followed by a diffusion step of the bond coat into the superalloy. Deposition and diffusion can also be carried out in a single step.

The materials generally used to make this bond coat include alumina forming metal alloys of the MCrAlY type (M=Ni (nickel) or Co (cobalt)) or a mixture of Ni and Co, Cr=chromium, Al=aluminum and Y=yttrium, or nickel aluminide (NixAly) type alloys, some also containing platinum (NixAlyPtz).

The second layer, generally called a thermal barrier coating (TBC), is a ceramic coating comprising, for example, yttriated zirconia, also called yttria stabilized zirconia (YSZ) or yttria partially stabilized zirconia (YPSZ), and having a porous structure. This layer can be deposited by various processes, such as electron beam physical vapor deposition (EB-PVD), atmospheric plasma spraying (APS), suspension plasma spraying (SPS), or other processes to produce a porous ceramic coating with low thermal conductivity.

Due to the use of these materials at high temperatures, for example 650° C. to 1150° C., microscopic interdiffusion phenomena occur between the nickel-based superalloy of the substrate and the metal alloy of the bond coat. These interdiffusion phenomena, associated with the oxidation of the bond coat, modify in particular the chemical composition, the microstructure and consequently the mechanical properties of the bond coat as soon as the coating is manufactured, then during the use of the blade in the turbine. These interdiffusion phenomena also modify the chemical composition, the microstructure and consequently the mechanical properties of the superalloy of the substrate under the coating. In superalloys with a high content of refractory elements, particularly rhenium, a secondary reaction zone (SRZ) can thus be formed in the superalloy under the coating over a depth of several tens, or even hundreds, of micrometers. The mechanical characteristics of this SRZ are significantly lower than those of the superalloy substrate. The formation of SRZs is undesirable because it leads to a significant reduction in the mechanical strength of the superalloy.

These changes in the bond coat, together with the stress fields associated with the growth of the alumina layer that forms in service on the surface of this bond coat, also known as thermally grown oxide (TGO), and the differences in the coefficients of thermal expansion between the different layers, generate de-cohesions in the interfacial zone between the sublayer and the ceramic coating, which can lead to partial or total flaking of the ceramic coating. The metal part (superalloy substrate and metallic bond coat) is then exposed and directly exposed to the combustion gases, which increases the risk of damage to the blade and thus to the gas turbine.

In addition, the complex chemistry of these alloys can lead to a destabilization of their optimal microstructure with the appearance of undesirable phase particles during high-temperature maintenance of parts formed from these alloys. This destabilization has negative consequences on the mechanical properties of these alloys. These undesirable phases of complex crystal structure and brittle nature are called topologically close-packed (TCP) phases.

In addition, casting defects may form in components, such as blades, when they are manufactured by directional solidification. These defects are usually "freckle" type grain defects, the presence of which can cause premature failure of the part in service. The presence of these defects, linked to the chemical composition of the superalloy, generally leads to rejection of the component, which increases the production cost.

Presentation

The present disclosure aims to propose nickel-based superalloy compositions for the manufacture of single-crystal components, with improved performance in terms of service life and mechanical strength, and allowing a reduction in part production costs (reduced scrap rate) compared with existing alloys. These superalloys have a higher creep resistance at high temperature than existing alloys while exhibiting good microstructural stability in the volume of the superalloy (low sensitivity to TCP formation), good microstructural stability under the thermal barrier coating bond coat (low sensitivity to SRZ formation), good resistance to oxidation and corrosion while avoiding the formation of "freckle" type parasitic grains.

For this purpose, the present disclosure relates to a nickel-based superalloy comprising, in percentages by mass, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 4.30% platinum, 0 to 0.15% silicon, the remainder consisting of nickel and unavoidable impurities.

This superalloy is intended for the manufacture of single-crystal gas turbine components, such as fixed or moving blades.

Thanks to this composition of the nickel (Ni)-based superalloy, the creep resistance is improved compared with existing superalloys, particularly at temperatures up to 1200° C.

This alloy therefore has improved high temperature creep resistance. This alloy also has improved corrosion and oxidation resistance.

These superalloys have a density less than or equal to 9.00 g/cm$^3$ (grams per cubic centimeter), preferably less than or equal to 8.85 g/cm$^3$.

A single-crystal nickel-based superalloy component is obtained by a process of directed solidification under a thermal gradient in an investment casting. The single-crystal nickel-based superalloy comprises an austenitic matrix with a face-centered cubic structure, a nickel-based solid solution known as the gamma ($\gamma$) phase. This matrix contains gamma prime ($\gamma'$) hardening phase precipitates of $L1_2$ ordered cubic structure of $Ni_3Al$ type. The set (matrix and precipitates) is thus described as a $\gamma/\gamma'$ superalloy.

In addition, this composition of the nickel-based superalloy allows the implementation of a heat treatment that brings back into solution the $\gamma'$ phase precipitates and the $\gamma/\gamma'$ eutectic phases that are formed during the solidification of the superalloy. Thus, a single-crystal nickel-based superalloy can be obtained containing $\gamma'$ precipitates of controlled size, preferably between 300 and 500 nanometers (nm), and containing a small proportion of the $\gamma/\gamma'$ eutectic phases.

The heat treatment also makes it possible to control the volume fraction of the $\gamma'$ phase precipitates present in the single-crystal nickel-based superalloy. The volume percentage of $\gamma'$ phase precipitates may be greater than or equal to 50%, preferably greater than or equal to 60%, even more preferably equal to 70%.

The major addition elements are cobalt (Co), chromium (Cr), molybdenum (Mo), rhenium (Re), tungsten (W), aluminum (Al), titanium (Ti), tantalum (Ta) and platinum (Pt).

The minor addition elements are hafnium (Hf) and silicon (Si), for which the maximum mass content is less than 1% by mass.

Unavoidable impurities include, for example, sulfur (S), carbon (C), boron (B), yttrium (Y), lanthanum (La) and cerium (Ce). Unavoidable impurities are defined as those elements that are not intentionally added to the composition and are brought in with other elements. For example, the superalloy may contain 0.005% by mass of carbon.

The addition of tungsten, chromium, cobalt, rhenium or molybdenum is mainly used to reinforce the austenitic matrix $\gamma$ of face-centered cubic (fcc) crystal structure by solid solution hardening.

The addition of aluminum (Al), titanium (Ti) or tantalum (Ta) promotes the precipitation of the hardening phase $\gamma'$-$Ni_3$(Al, Ti, Ta).

Rhenium (Re) slows down the diffusion of chemical species within the superalloy and limits the coalescence of $\gamma'$ phase precipitates during service at high temperature, a phenomenon that leads to a reduction in mechanical strength. Rhenium thus improves the creep resistance at high temperature of the nickel-based superalloy. However, too high a rhenium concentration can lead to the precipitation of TCP intermetallic phases, for example $\sigma$ phase, P phase or $\mu$ phase, which have a negative effect on the mechanical properties of the superalloy. An excessive rhenium concentration can also lead to the formation of a secondary reaction zone in the superalloy below the bond coat, which has a negative effect on the mechanical properties of the superalloy.

The simultaneous addition of silicon and hafnium improves the hot oxidation resistance of nickel-based superalloys by increasing the adhesion of the alumina ($Al_2O_3$) layer that forms on the surface of the superalloy at high temperature. This alumina layer forms a passivation layer on the surface of the nickel-based superalloy and a barrier to the diffusion of oxygen from the outside to the inside of the nickel-based superalloy. However, hafnium can be added without also adding silicon or, conversely, silicon can be added without also adding hafnium and still improve the hot oxidation resistance of the superalloy.

In addition, the addition of chromium or aluminum improves the superalloy's resistance to oxidation and high-temperature corrosion. In particular, chromium is essential for increasing the hot corrosion resistance of nickel-based superalloys. However, too high a chromium content tends to reduce the solvus temperature of the $\gamma'$ phase of the nickel-based superalloy, i.e. the temperature above which the $\gamma'$ phase is completely dissolved in the $\gamma$ matrix, which is undesirable. Therefore, the chromium concentration is between 6.0 and 7.0% by mass in order to maintain a high solvus temperature of the $\gamma'$ phase of the nickel-based superalloy, for example greater than or equal to 1250° C., but also to avoid the formation of topologically compact phases in the $\gamma$ matrix that are highly saturated with alloying elements such as rhenium, molybdenum or tungsten.

The addition of platinum increases the temperature stability of the $\gamma'$ phase by keeping the fraction of $\gamma'$ phase hardening precipitates high compared with common alloys where this fraction decreases significantly as temperature increases. This maintenance of a high proportion of $\gamma'$ precipitates at high temperature allows maintenance of the mechanical properties of the alloy at temperatures close to the $\gamma'$ solvus temperature of the alloy (see FIG. 2). In addition, the addition of platinum improves the superalloy's resistance to oxidation and corrosion. The addition of platinum to the superalloy thus improves the service life of the system comprising a metallic coated superalloy with a thermal barrier. When using a superalloy with a NixPtyAlz type metallic coating, the addition of platinum to the chemical composition of the superalloy reduces, or eliminates, the addition of platinum in the coating.

The addition of cobalt, which is an element close to nickel and partially substitutes for nickel, forms a solid solution with the nickel in the $\gamma$ matrix. The cobalt strengthens the $\gamma$ matrix and reduces the susceptibility to TCP precipitation and the formation of SRZ in the superalloy under the protective coating. However, too high a cobalt content tends to reduce the solvus temperature of the $\gamma'$ phase of the nickel-based superalloy, which is undesirable.

The addition of refractory elements such as molybdenum, tungsten, rhenium or tantalum slows down the mechanisms controlling the creep of nickel-based superalloys which depend on the diffusion of chemical elements into the superalloy.

A very low sulfur content in a nickel-based superalloy increases the resistance to oxidation and hot corrosion as well as the thermal barrier's resistance to flaking. Thus, a low sulfur content, less than 2 ppm by mass (parts per million by mass), or ideally less than 0.5 ppm by mass, makes it possible to optimize these properties. Such a mass content of sulfur can be obtained by producing a low-sulfur mother melt or by a desulfurization process carried out after casting. In particular, it is possible to maintain a low sulfur content by adapting the superalloy production process.

Nickel-based superalloys are defined as superalloys with a majority nickel content by mass percentage. It is understood that nickel is therefore the element with the highest mass percentage in the alloy.

The superalloy may comprise, in percentages by mass, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 1.70 to 4.30% platinum, 0 to 0.15% silicon, the remainder being nickel and unavoidable impurities.

The superalloy may comprise, in percentages by mass, 5.0 to 6.0% aluminum, 6.0 to 7.0% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 1.70 to 4.30% platinum, 0 to 0.15% silicon, the remainder being nickel and unavoidable impurities.

The superalloy may comprise, in percentages by mass, 5.0 to 6.0% aluminum, 8.5 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 1.50% rhenium, 0.05 to 0.15% hafnium, 1.70 to 3.30% platinum, 0 to 0.15% silicon, the remainder being nickel and unavoidable impurities.

The superalloy may comprise, in percentages by mass, 5.0 to 6.0% aluminum, 6.0 to 9.5% tantalum, 8.0 to 10.0% cobalt, 6.0 to 7.0% chromium, 0.30 to 0.90% molybdenum, 5.5 to 6.5% tungsten, 0.05 to 0.15% hafnium, 2.70 to 4.30% platinum, 0 to 0.15% silicon, the remainder being nickel and unavoidable impurities.

The superalloy may comprise, in percentages by mass, 5.0 to 6.0% aluminum, 6.0 to 9.5% tantalum, 0.50 to 1.50% titanium, 8.0 to 10.0% cobalt, 6.0 to 7.0% chromium, 0.30 to 0.90% molybdenum, 5.5 to 6.5% tungsten, 0.05 to 0.15% hafnium, 2.70 to 4.30% platinum, 0 to 0.15% silicon, the remainder being nickel and unavoidable impurities.

The superalloy may comprise, in percentages by mass, 5.0 to 6.0% aluminum, 6.0 to 9.5% tantalum, 0.80 to 1.20% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 3.30% platinum, 0 to 0.15% silicon, the remainder being nickel and unavoidable impurities.

The superalloy may comprise, in percentages by mass, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 4.30% platinum, 0.10% silicon, the remainder being nickel and unavoidable impurities.

The superalloy may comprise, in percentages by mass, 5.0 to 6.0% aluminum, 6.0 to 7.0% tantalum, 0.80 to 1.20% titanium, 8.0 to 10.0% cobalt, 6.0 to 7.0% chromium, 0.30 to 0.90% molybdenum, 5.5 to 6.5% tungsten, 0.05 to 0.15% hafnium, 2.70 to 3.30% platinum, 0 to 0.15% silicon, the remainder being nickel and unavoidable impurities.

The superalloy may comprise, in percentages by mass, 5.0 to 6.0% aluminum, 6.0 to 7.0% tantalum, 0.80 to 1.20% titanium, 8.0 to 10.0% cobalt, 6.0 to 7.0% chromium, 0.30 to 0.90% molybdenum, 5.5 to 6.5% tungsten, 0.70 to 1.30% rhenium, 0.05 to 0.15% hafnium, 1.70 to 2.30% platinum, 0 to 0.15% silicon, the remainder being nickel and unavoidable impurities.

The superalloy may comprise, in percentages by mass, 5.0 to 6.0% aluminum, 6.0 to 7.0% tantalum, 0.80 to 1.20% titanium, 8.0 to 10.0% cobalt, 6.0 to 7.0% chromium, 0.30 to 0.90% molybdenum, 5.5 to 6.5% tungsten, 1.70 to 2.30% rhenium, 0.05 to 0.15% hafnium, 0.70 to 1.30% platinum, 0 to 0.15% silicon, the remainder being nickel and unavoidable impurities.

The superalloy may comprise, in percentages by mass, 5.0 to 6.0% aluminum, 6.0 to 7.0% tantalum, 8.0 to 10.0% cobalt, 6.0 to 7.0% chromium, 0.30 to 0.90% molybdenum, 5.5 to 6.5% tungsten, 0.05 to 0.15% hafnium, 3.70 to 4.30% platinum, 0 to 0.15% silicon, the remainder being nickel and unavoidable impurities.

The superalloy may comprise, in percentages by mass, 5.0 to 6.0% aluminum, 8.5 to 9.5% tantalum, 0.80 to 1.20% titanium, 8.0 to 10.0% cobalt, 6.0 to 7.0% chromium, 0.30 to 0.90% molybdenum, 5.5 to 6.5% tungsten, 0.70 to 2.30% rhenium, 0.05 to 0.15% hafnium, 1.70 to 2.30% platinum, 0 to 0.15% silicon, the remainder being nickel and unavoidable impurities.

The superalloy may comprise, in percentages by mass, 5.0 to 6.0% aluminum, 8.5 to 9.5% tantalum, 8.0 to 10.0% cobalt, 6.0 to 7.0% chromium, 0.30 to 0.90% molybdenum, 5.5 to 6.5% tungsten, 0.05 to 0.15% hafnium, 2.70 to 3.30% platinum, 0 to 0.15% silicon, the remainder being nickel and unavoidable impurities.

The superalloy may comprise, in percentages by mass, 5.0 to 6.0% aluminum, 8.5 to 9.5% tantalum, 0.80 to 1.20% titanium, 8.0 to 10.0% cobalt, 6.0 to 7.0% chromium, 0.30 to 0.90% molybdenum, 5.5 to 6.5% tungsten, 0.05 to 0.15% hafnium, 2.70 to 3.30% platinum, 0.10% silicon, the remainder being nickel and unavoidable impurities.

The superalloy may comprise, in percentages by mass, 5.6% aluminum, 6.5% tantalum, 1.00% titanium, 9.0% cobalt, 6.5% chromium, 0.60% molybdenum, 6.0% tungsten, 0.10% hafnium, 3.00% platinum, the remainder being nickel and unavoidable impurities.

The superalloy may comprise, in percentages by mass, 5.6% aluminum, 6.5% tantalum, 1.00% titanium, 9.0% cobalt, 6.5% chromium, 0.60% molybdenum, 6.0% tungsten, 1.00% rhenium, 0.10% hafnium, 2.00% platinum, the remainder being nickel and unavoidable impurities.

The superalloy may comprise, in percentages by mass, 5.6% aluminum, 6.5% tantalum, 1.00% titanium, 9.0% cobalt, 6.5% chromium, 0.60% molybdenum, 6.0% tungsten, 2.00% rhenium, 0.10% hafnium, 1.00% platinum, the remainder being nickel and unavoidable impurities.

The superalloy may comprise, in percentages by mass, 5.6% aluminum, 6.5% tantalum, 9.0% cobalt, 6.5% chromium, 0.60% molybdenum, 6.0% tungsten, 0.10% hafnium, 4.00% platinum, the remainder being nickel and unavoidable impurities.

The superalloy may comprise, in percentages by mass, 5.6% aluminum, 9.0% tantalum, 1.00% titanium, 9.0% cobalt, 6.5% chromium, 0.60% molybdenum, 6.0% tungsten, 1.00% rhenium, 0.10% hafnium, 2.00% platinum, the remainder being nickel and unavoidable impurities.

The superalloy may comprise, in percentages by mass, 5.6% aluminum, 9.0% tantalum, 9.0% cobalt, 6.5% chromium, 0.60% molybdenum, 6.0% tungsten, 0.10% hafnium, 3.00% platinum, the remainder being nickel and unavoidable impurities.

The superalloy may comprise, in percentages by mass, 5.6% aluminum, 6.5% tantalum, 1.00% titanium, 9.0% cobalt, 6.5% chromium, 0.60% molybdenum, 6.0% tungsten, 1.00% rhenium, 0.10% hafnium, 2.00% platinum, the remainder being nickel and unavoidable impurities.

The superalloy may comprise, in percentages by mass, 5.6% aluminum, 9.0% tantalum, 1.00% titanium, 9.0% cobalt, 6.5% chromium, 0.60% molybdenum, 6.0% tungsten, 0.10% hafnium, 3.00% platinum, 0.10% silicon, the remainder being nickel and unavoidable impurities.

The present disclosure also relates to a single-crystal blade for turbomachines comprising a superalloy as defined above.

This blade therefore has improved creep resistance at high temperatures. This blade therefore has improved oxidation and corrosion resistance.

The blade may comprise a protective coating comprising a metallic bond coat deposited on the superalloy and a ceramic thermal barrier deposited on the metallic bond coat.

Due to the composition of the nickel-based superalloy, the formation of a secondary reaction zone in the superalloy resulting from interdiffusion phenomena between the superalloy and the bond coat is avoided, or limited.

The metallic bond coat can be an MCrAlY type alloy or a nickel aluminide type alloy.

Due to the composition of the nickel-based superalloy, the addition of platinum is reduced, or even eliminated, in the metallic bond coat of the $Ni_xAl_yPt_z$ type coating.

The ceramic thermal barrier can be an yttriated zirconia-based material or any other ceramic (zirconia-based) coating with low thermal conductivity.

The blade may have a structure oriented in a<001> crystallographic direction.

This orientation generally gives the optimal mechanical properties to the blade.

The present disclosure also relates to a turbomachine comprising a blade as defined above.

BRIEF DESCRIPTION OF THE DRAWINGS

Other features and advantages of the subject matter of the present disclosure will be apparent from the following description of embodiments, given by way of non-limiting examples, with reference to the appended figures, wherein.

In all the figures, common elements are identified by identical numerical references.

DETAILED DESCRIPTION

Nickel-based superalloys are intended for the manufacture of single-crystal blades by a process of directed solidification in a thermal gradient. The use of a monocrystalline seed or grain selector at the beginning of solidification makes it possible to obtain this monocrystalline structure. The structure is oriented, for example, in a<001> crystallographic direction which is the orientation that generally confers the optimum mechanical properties on superalloys.

Solidified single-crystal nickel-based superalloys have a dendritic structure and consist of γ' $Ni_3$(Al, Ti, Ta) precipitates dispersed in a γ matrix of face-centered cubic structure, a nickel-based solid solution. These γ' phase precipitates are heterogeneously distributed in the volume of the single crystal due to chemical segregations resulting from the solidification process. In addition, γ/γ' eutectic phases are present in the inter-dendritic regions and are preferred crack initiation sites. These γ/γ' eutectic phases are formed at the end of solidification. Moreover, the γ/γ' eutectic phases are formed to the detriment of the fine precipitates (size lower than one micrometer) of the γ' hardening phase. These γ' phase precipitates constitute the main source of hardening of nickel-based superalloys. Also, the presence of residual γ/γ' eutectic phases does not allow optimization of the hot creep resistance of the nickel-based superalloy.

It has indeed been shown that the mechanical properties of superalloys, in particular the creep resistance, were optimal when the precipitation of the γ' precipitates was ordered, i.e. the γ' phase precipitates were aligned in a regular way, with a size ranging from 300 to 500 nm, and when the totality of the γ/γ' eutectic phases was put back into solution.

Raw solidified nickel-based superalloys are therefore heat-treated to obtain the desired distribution of the different phases. The first heat treatment is a homogenization treatment of the microstructure which aims to dissolve the γ' phase precipitates and to eliminate the γ/γ' eutectic phases or to significantly reduce their volume fraction. This treatment is carried out at a temperature higher than the solvus temperature of the γ' phase and lower than the starting melting temperature of the superalloy ($T_{solidus}$). A quenching is then carried out at the end of this first heat treatment to obtain a fine and homogeneous dispersion of the γ' precipitates. Tempering heat treatments are then carried out in two stages, at temperatures below the solvus temperature of the γ' phase. In a first step, to grow the γ' precipitates to the desired size, then in a second step, to grow the volume fraction of this phase to about 70% at room temperature.

Figure 1:
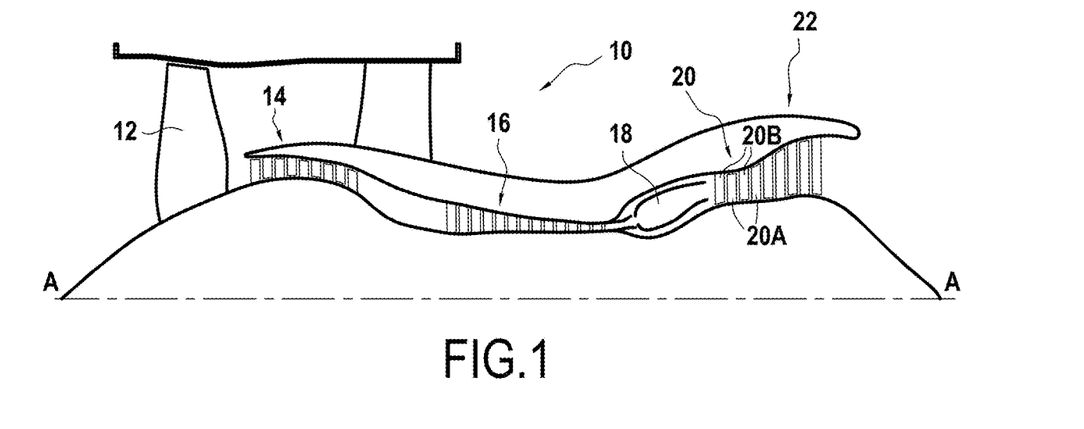
FIG. 1 is a schematic longitudinal section view of a turbomachine.

FIG. 1 shows a vertical cross-section of a bypass turbofan engine 10 in a vertical plane through its main axis A. The turbofan engine 10 comprises, from upstream to downstream according to the flow of air, a fan 12, a low-pressure compressor 14, a high-pressure compressor 16, a combustor 18, a high-pressure turbine 20, and a low-pressure turbine 22.

The high-pressure turbine 20 comprises a plurality of moving blades 20A rotating with the rotor and rectifiers 20B (stationary blades) mounted on the stator. The stator of the turbine 20 comprises a plurality of stator rings 24 arranged opposite to the moving blades 20A of the turbine 20.

These properties thus make these superalloys interesting candidates for the manufacture of single-crystal parts for the hot parts of turbojet engines.

A moving blade 20A or a rectifier 20B for turbomachinery comprising a superalloy as defined above can therefore be manufactured.

Alternatively, a moving blade 20A or rectifier 20B for a turbomachine comprising a superalloy as defined above coated with a protective coating comprising a metallic bond coat.

A turbomachine can in particular be a turbojet engine such as a turbofan engine 10. A turbomachine may also be a single-flow turbojet engine, a turboprop engine or a turboshaft engine.

EXAMPLES

Eight single-crystal nickel-based superalloys of the present disclosure (Ex 1 to Ex 8) were studied and compared with five commercial single-crystal superalloys: René N5 (Ex 9), CMSX-4 (Ex 10), CMSX-4 Plus Mod C (Ex 11), Rene N6 (Ex 12), CMSX-10 K (Ex 13) and an experimental superalloy containing platinum (Ex 14), cited in the publication J. S. Van Sluytman, C. J. Moceri, and T. M. Pollock, "A Pt-modified Ni-base superalloy with high temperature precipitate stability," Mater. Sci. Eng. A, vol. 639, pp. 747-754, July 2015. The chemical composition of each of the single-crystal superalloys is given in Table 1, the composition Ex 7 further comprising 0.03% by mass carbon, Ex 13 further comprising 0.10% by mass niobium (Nb), Ex 12 further comprising 0.05% by mass carbon (C) and 0.004% by mass boron (B), and Ex 14 further comprising 0.02% by mass carbon, 0.015% by mass boron and 0.02% by mass zircon. All these superalloys are nickel-based superalloys, i.e. the remainder to 100% of the compositions shown consists of nickel and unavoidable impurities.

Figure 2:
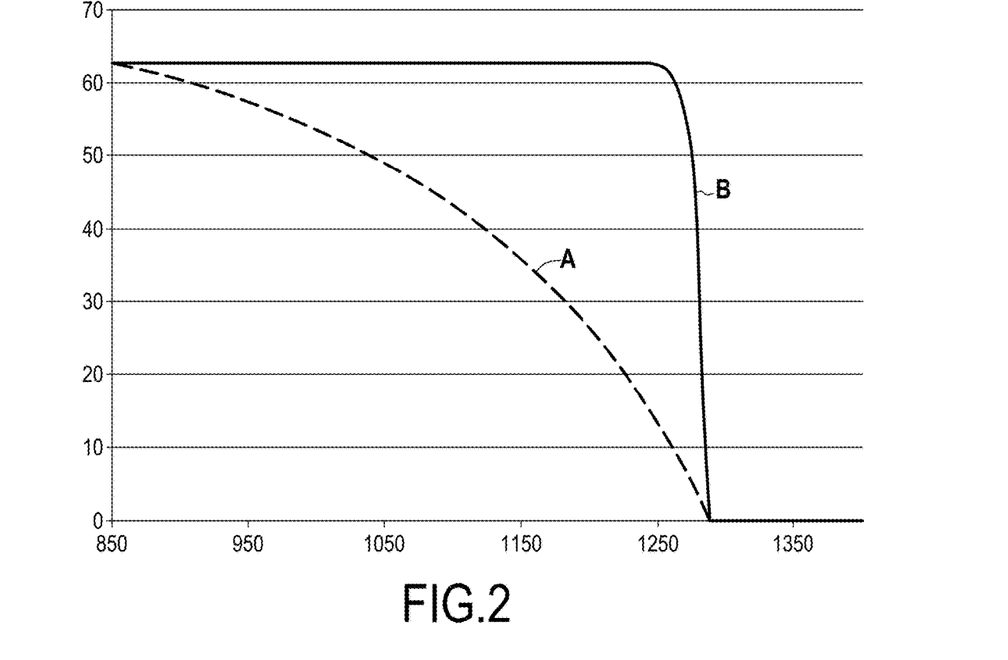
FIG. 2 is a graph representing the change in the γ' phase volume fraction as a function of temperature.

Superalloys Ex 1 to Ex 8 show a change in the volume fraction of the γ' phase as a function of temperature according to curve B of FIG. 2, while Ex 9 to Ex 14 superalloys show a change in the volume fraction of the γ' phase as a function of temperature according to curve A of FIG. 2.

TABLE 1

|  | Al | Ta | Ti | Co | Cr | Mo | W | Re | Hf | Pt | Si |
|---|---|---|---|---|---|---|---|---|---|---|---|
| Ex 1 | 5.6 | 6.5 | 1.00 | 9.0 | 6.5 | 0.60 | 6.0 | 0 | 0.10 | 3.00 | 0 |
| Ex 2 | 5.6 | 6.5 | 1.00 | 9.0 | 6.5 | 0.60 | 6.0 | 1.00 | 0.10 | 2.00 | 0 |
| Ex 3 | 5.6 | 6.5 | 1.00 | 9.0 | 6.5 | 0.60 | 6.0 | 2.00 | 0.10 | 1.00 | 0 |
| Ex 4 | 5.6 | 6.5 | 0 | 9.0 | 6.5 | 0.60 | 6.0 | 0 | 0.10 | 4.00 | 0 |
| Ex 5 | 5.6 | 9.0 | 1.00 | 9.0 | 6.5 | 0.60 | 6.0 | 1.00 | 0.10 | 2.00 | 0 |
| Ex 6 | 5.6 | 9.0 | 0 | 9.0 | 6.5 | 0.60 | 6.0 | 0 | 0.10 | 3.00 | 0 |
| Ex 7 | 5.6 | 6.5 | 1.00 | 9.0 | 6.5 | 0.60 | 6.0 | 1.00 | 0.10 | 2.00 | 0 |
| Ex 8 | 5.6 | 9.0 | 1.00 | 9.0 | 6.5 | 0.60 | 6.0 | 0 | 0.10 | 3.00 | 0.01 |
| Ex 9 | 6.2 | 6.0 | 0 | 8.0 | 7.0 | 2.00 | 5.0 | 3.00 | 0.20 | 0 | 0 |
| Ex 10 | 5.6 | 6.5 | 1.00 | 9.0 | 6.5 | 0.60 | 6.0 | 3.00 | 0.10 | 0 | 0 |
| Ex 11 | 5.7 | 8.0 | 0.85 | 10.0 | 3.50 | 0.60 | 6.0 | 4.40 | 0.10 | 0 | 0 |
| Ex 12 | 6.0 | 7.5 | 0 | 12.2 | 4.40 | 1.10 | 5.7 | 5.3 | 0.15 | 0 | 0 |
| Ex 13 | 5.7 | 8.0 | 0.20 | 3.00 | 2.00 | 0.40 | 5.0 | 6.0 | 0.03 | 0 | 0 |
| Ex 14 | 5.8 | 5.8 | 0.40 | 0 | 6.2 | 1.50 | 2.90 | 3.00 | 0.30 | 7.8 | 0.20 |

Density

The density at room temperature of each superalloy was estimated using a modified version of the Hull formula (F. C. Hull, Metal Progress, November 1969, pp 139-140). The density is expressed in g·cm$^{-3}$ (gram per cubic centimeter). This empirical equation was proposed by Hull. The empirical equation is based on the law of mixtures and includes corrective terms derived from a linear regression analysis of experimental data (chemical compositions and measured densities) for 235 superalloys and stainless steels. This Hull formula has been modified, in particular to take account of elements such as rhenium and ruthenium. The modified Hull formula given by P. Carondans "High gamma prime solvus New Generation Nickel-Based Superalloys for Single Crystal Turbine Blade Applications", 2000, pp 737-746 is as follows:

$$d=8.29604-0.00435 \text{ wt \% } Co-0.0164 \text{ wt \% } (Cr+Mo)+0.06274 \text{ wt \% } W+0.0593 \text{ wt \% } (Re+Pt)+0.01811 \text{ wt \% } Ru-0.06595 \text{ wt \% } Al-0.0236 \text{ wt \% } Ti+0.05441 \text{ wt \% } Ta \quad (1)$$

where wt % Co, wt % (Cr+Mo), . . . , wt % Ta are the percentages by mass of the elements Co, (Cr+Mo), . . . , Ta.

where d is the density of the superalloy expressed in g/cm$^3$.

For example, the density of superalloy Ex 5 is estimated at 8.81 g/cm$^3$ and the measured value is 8.83 g/cm$^3$. The density is measured with a helium pycnometer. The above modified Hull formula is therefore a good match for the measured density of the superalloys.

The densities calculated for the alloys of the invention and for the reference alloys are less than 8.90 g/cm$^3$, preferably less than 8.85 g/cm$^3$ (see Table 2).

Table 2 shows different parameters for superalloys Ex 1 to Ex 12.

TABLE 2

|  | Estimated density (1) (g/cm$^3$) | NFP | SRZ(%)]$^{1/2}$ | Cost (euros/kg) | δ' at 25° C. (%) | δ' at 1100° C. (%) |
|---|---|---|---|---|---|---|
| Ex 1 | 8.67 | 1.08 | −29.91 | 1019.28 | 0.248 | −0.065 |
| Ex 2 | 8.67 | 0.90 | −25.72 | 721.98 | 0.250 | −0.136 |
| Ex 3 | 8.67 | 0.77 | −21.54 | 424.68 | 0.274 | −0.207 |
| Ex 4 | 8.76 | 1.16 | −29.61 | 1329.38 | 0.363 | 0.047 |
| Ex 5 | 8.81 | 1.24 | −26.05 | 724.84 | 0.257 | −0.205 |
| Ex 6 | 8.83 | 1.58 | −30.36 | 1012.07 | 0.313 | −0.007 |
| Ex 7 | 8.67 | 0.90 | −25.72 | 721.98 | 0.251 | −0.130 |
| Ex 8 | 8.81 | 1.49 | −30.30 | 1022.14 | 0.152 | −0.141 |
| Ex 9 | 8.58 | 0.85 | −21.95 | 118.34 | 0.182 | −0.274 |
| Ex 10 | 8.67 | 0.67 | −17.36 | 127.38 | 0.279 | −0.222 |
| Ex 11 | 8.90 | 0.68 | 3.70 | 160.20 | 0.363 | 0.005 |
| Ex 12 | 8.87 | 0.69 | 1.35 | 167.13 | 0.331 | −0.205 |
| Ex 13 | 8.98 | 0.67 | 15.56 | 170.94 | 0.256 | −0.185 |
| Ex 14 | 8.96 | 1.05 | −15.64 | 2612.21 | 0.262 | −0.134 |

No-Freckles Parameter (NFP)

$$NFP=[\% \ Ta+1.5\% \ Hf+0.5\% \ Mo-0.5\%\% \ Ti)]/[\% \ W+1.2\% \ Re)]. \quad (2)$$

where % Cr, % Ni, . . . % X are the contents, expressed in percentages by mass, of the superalloy elements Cr, Ni, . . . , X.

The NFP is used to quantify the sensitivity to the formation of freckles during the directed solidification of the component (document U.S. Pat. No. 5,888,451). To prevent the formation of freckles, the NFP must be greater than or equal to 0.7.

Figure 3:
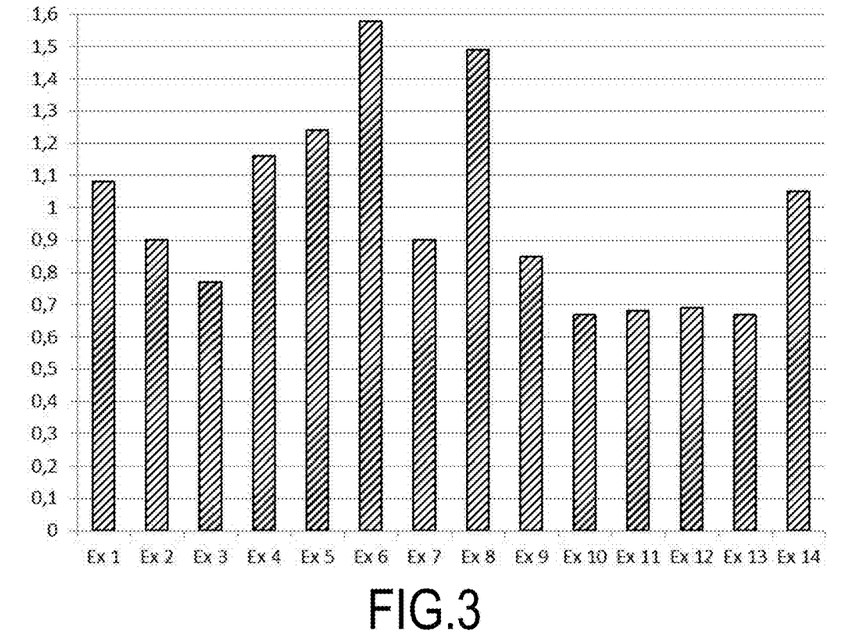
FIG. 3 is a graph representing the no-freckles parameter (NFP) for different superalloys.

As can be seen in Table 2 and FIG. 3, superalloys Ex 1 to Ex 8 all have an NFP greater than or equal to 0.7, while commercial superalloys Ex 10 to Ex 13 have an NFP less than 0.7.

Sensitivity to the Formation of SRZ

To estimate the sensitivity of rhenium-containing nickel-based superalloys to the formation of SRZ, Walston (document U.S. Pat. No. 5,270,123) established the following equation:

$$SRZ\ (\%)]^{1/2}=13.88\ (\%\ Re)+4.10\ (\%\ W)-7.07\ (\%\ Cr)-2.94\ (\%\ Mo)-0.33\ (\%\ Co)+12.13 \quad (3)$$

where SRZ (%) is the linear percentage of SRZ in the superalloy under the coating and where the concentrations of the alloying elements are in atomic percent.

This equation (3) was obtained by multiple linear regression analysis from observations made after aging for 400 hours at 1093° C. (degrees centigrade) of samples of various alloys with compositions close to composition Ex 12 under a NiPtAl coating.

The higher the value of the parameter $[SRZ\ (\%)]^{1/2}$, the more sensitive the superalloy is to SRZ formation. Thus, as can be seen in Table 2, for the superalloys Ex 1 to Ex 8, the values of the parameter $[SRZ\ (\%)]^{1/2}$ are all negative and these superalloys therefore have a low sensitivity to SRZ formation under a NitPtAl coating, as does the commercial superalloy Ex 12, which is known for its low sensitivity to SRZ formation, and the superalloys Ex 9, Ex 10 and Ex 14. By way of example, the commercial superalloy Ex 13, which is known to be very sensitive to the formation of SRZ under a NiPtAl coating, has a relatively high $[SRZ\ (\%)]^{1/2}$ parameter value.

Cost of the Alloys

The cost per kilogram of superalloys Ex 1 to Ex 14 is calculated on the basis of the composition of the superalloy and the costs of each compound (updated February 2018). This cost is given by way of illustration.

Crystalline Parameter Difference δ'

The crystalline parameter difference between phases γ and γ', also called 'Mismatch' δ' is expressed in percent. This parameter varies as a function of temperature due to the different thermal expansion coefficients of these two phases. It is considered to influence the mechanical properties and in particular the creep properties. When δ' is negative, or even weakly positive, the stability of the microstructure at the given temperature is promoted.

Phase γ' Solvus Temperature

The ThermoCalc software (Ni25 database) based on the CALPHAD method was used to calculate the solvus temperature of the γ' phase at equilibrium.

As can be seen in Table 3, superalloys Ex 1 to Ex 8 have a γ' solvus temperature similar to those of superalloys Ex 9 to Ex 14.

Solidus and Liquidus Temperature

The ThermoCalc software (Ni25 database) based on the CALPHAD method was used to calculate the solidus and liquidus temperatures of superalloys Ex 1 to Ex 14.

Phase γ' Volume Fraction

The ThermoCalc software (Ni25 database) based on the CALPHAD method was used to calculate the volume fraction (volume percent) of phase γ' at equilibrium in superalloys Ex 1 to Ex 14 at 950° C., 1050° C. and 1200° C.

Figure 4:
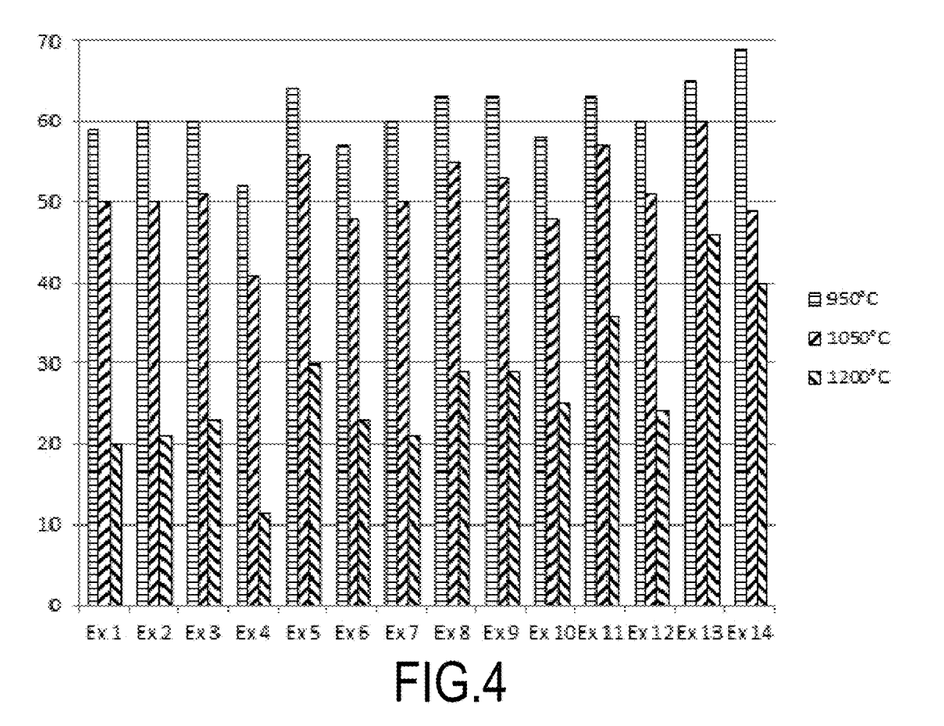
FIG. 4 is a graph representing the γ' phase volume fraction at different temperatures and for different superalloys.

As can be seen in Table 3 and FIG. 4, superalloys Ex 1 to Ex 8 contain phase γ' volume fractions greater than or comparable to the phase γ' volume fractions of commercial superalloys Ex 9 to Ex 14.

Thus, the combination of a high γ' solvus temperature and high γ' phase volume fractions for superalloys Ex 1 to Ex 8 is favorable for good creep resistance at high and very high temperatures, for example at 1200° C. This resistance should therefore be higher than the creep strength of commercial superalloys Ex 9 to Ex 12 and close to that of commercial superalloy Ex 11.

TABLE 3

| | Transformation temperature (° C.) | | | γ' phase volume fraction (% vol) | | |
|---|---|---|---|---|---|---|
| | Solvus | Solidus | Liquidus | 950° C. | 1050° C. | 1200° C. |
| Ex 1 | 1262 | 1317 | 1380 | 59 | 50 | 20 |
| Ex 2 | 1266 | 1316 | 1383 | 60 | 50 | 21 |
| Ex 3 | 1271 | 1315 | 1385 | 60 | 51 | 23 |
| Ex 4 | 1244 | 1354 | 1398 | 52 | 41 | 11.5 |
| Ex 5 | 1294 | 1292 | 1366 | 64 | 56 | 30 |
| Ex 6 | 1284 | 1337 | 1386 | 57 | 48 | 23 |
| Ex 7 | 1266 | 1316 | 1383 | 60 | 50 | 21 |
| Ex 8 | 1292 | 1292 | 1365 | 63 | 55 | 29 |
| Ex 9 | 1306 | 1300 | 1392 | 63 | 53 | 29 |
| Ex 10 | 1270 | 1310 | 1385 | 58 | 48 | 25 |
| Ex 11 | 1320 | 1330 | 1400 | 63 | 57 | 36 |
| Ex 12 | 1283 | 1319 | 1404 | 60 | 51 | 24 |
| Ex 13 | 1373 | 1381 | 1428 | 65 | 60 | 46 |
| Ex 14 | 1337 | 1343 | 1386 | 69 | 49 | 40 |

Volume Fraction of TCP Type σ

The ThermoCalc software (nickel database) based on the CALPHAD method was used to calculate the volume fraction (in volume percent) of phase σ at equilibrium in superalloys Ex 1 to Ex 14 at 950° C. and 1050° C. (see table 4).

The calculated volume fractions of the σ phase are relatively low, reflecting a low sensitivity to TCP precipitation.

Mass Concentration of Chromium Dissolved in the γ Matrix

The ThermoCalc software (Ni25 database) based on the CALPHAD method was used to calculate the chromium content (in percent by mass) in the γ phase at equilibrium in superalloys Ex 1 to Ex 14 at 950° C. 1200° C.

As can be seen in Table 4, the chromium concentrations in the γ phase are higher or similar for superalloys Ex 1 to Ex 8, compared with the chromium concentrations in the γ phase for commercial superalloys Ex 9 to Ex 13, which is favorable to better corrosion and hot oxidation resistance.

TABLE 4

| | Volume fraction of TCP type σ (in % vol) | | Chromium content in the γ phase (in % by mass) | |
|---|---|---|---|---|
| | 950° C. | 1050° C. | 950° C. | 1200° C. |
| Ex 1 | 0 | 0 | 12.3 | 7.5 |
| Ex 2 | 0 | 0 | 12.4 | 7.6 |
| Ex 3 | 0 | 0 | 12.5 | 7.7 |
| Ex 4 | 0 | 0 | 10.7 | 7.0 |
| Ex 5 | 0 | 0 | 14.0 | 8.3 |
| Ex 6 | 0 | 0 | 12.1 | 7.7 |
| Ex 7 | 0 | 0 | 12.4 | 7.6 |
| Ex 8 | 0 | 0 | 13.9 | 8.2 |
| Ex 9 | 0.3 | 0 | 13.3 | 8.6 |
| Ex 10 | 0.7 | 0 | 10.9 | 7.8 |
| Ex 11 | 1.2 | 0.5 | 6.4 | 4.8 |
| Ex 12 | 1.0 | 0.3 | 7.1 | 5.3 |
| Ex 13 | 0.9 | 0.4 | 3.4 | 2.8 |
| Ex 14 | 0.07 | 0 | 12.1 | 8.4 |

Mechanical Properties

Figure 5:
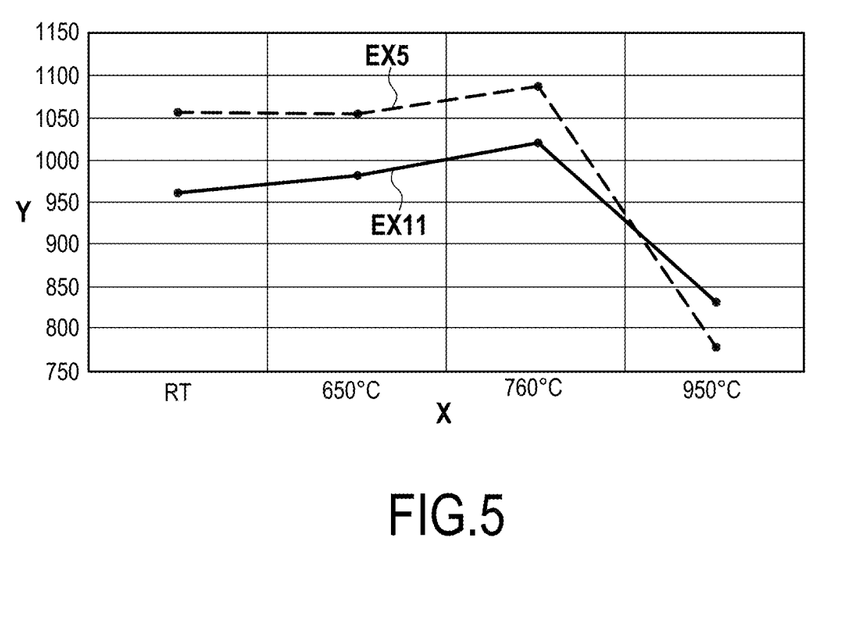
FIG. 5 is a graph representing yield strength at 0.2% as a function of temperature for two superalloys.

FIG. 5 represents the change in yield strength at 0.2% (in MPa) as a function of temperature (in ° C.) for superalloy Ex 5 and superalloy Ex 11 at 650° C., 760° C. and 950° C.

Figure 6:
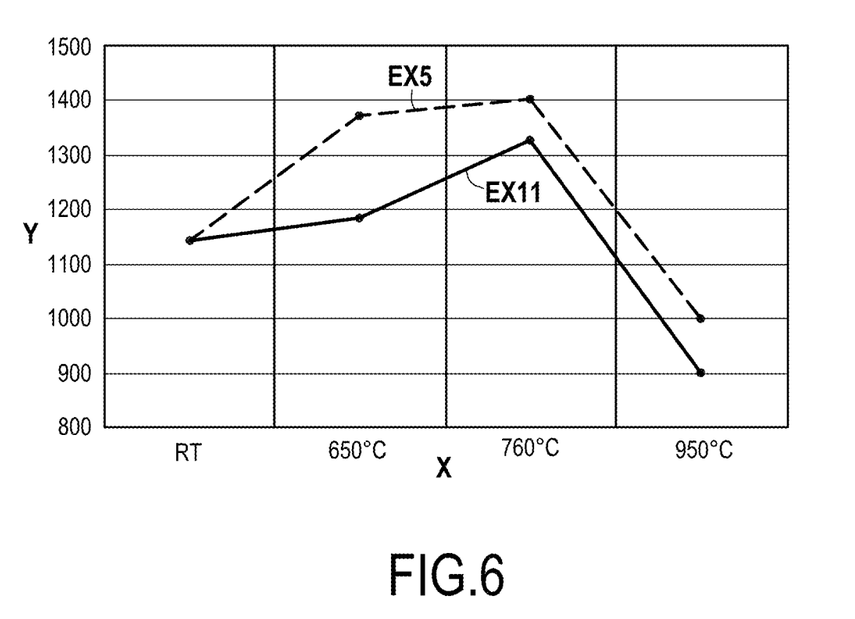
FIG. 6 is a graph representing tensile strength as a function of temperature for the two superalloys of FIG. 5.

FIG. 6 represents the change in tensile strength at break (in MPa) as a function of temperature (in ° C.) for superalloy Ex 5 and superalloy Ex 11 at 650° C., 760° C. and 950° C.

The 0.2% yield strength and the tensile strength are measured according to standards ISO 6892-1 at room temperature and ISO 6892-2 for temperatures greater than room temperature.

As can be seen in FIG. 5, superalloy Ex 5 has a yield strength of 0.2% and a tensile strength similar to that of superalloy Ex 11.

Oxidation Property

Figure 7:
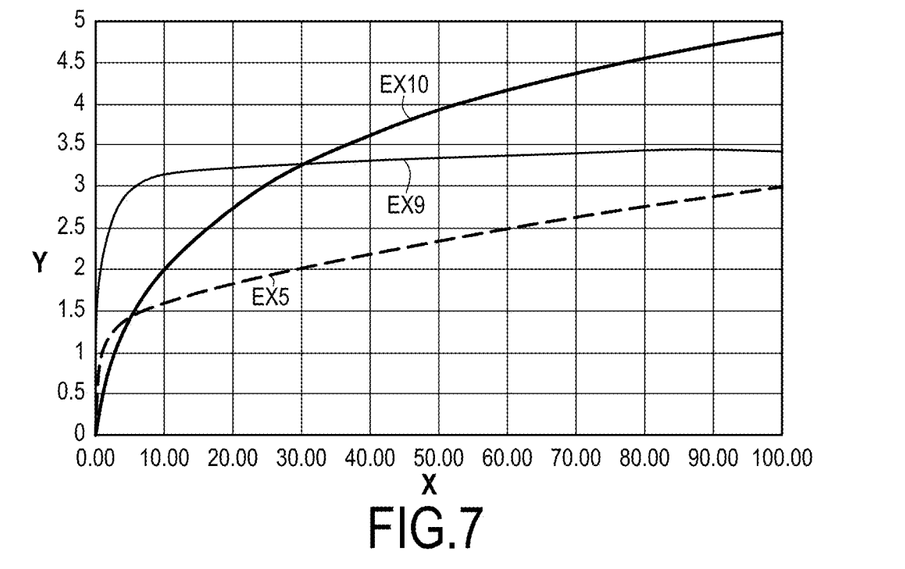
FIG. 7 is a graph representing mass gain as a function of time at 1000° C. for three superalloys.

The oxidation properties of superalloys Ex 5, Ex 9 and Ex 10 are shown in FIG. 7. The mass gain (in g/m$^2$) as a function of time (in hours) of the superalloys was measured at 1000° C. As shown in FIG. 7, it can be seen that superalloy Ex 5 has a lower mass gain than superalloys Ex 9 and Ex 10 after less than 10 hours of testing at 1000° C.

The test is carried out on pellets of the studied material with a diameter of 14 mm and a thickness of 1.2 to 1.4 mm. The oxidation test, also called thermogravimetric analysis test, is carried out under a constant flow of synthetic air (21% $O_2$+79% $N_2$), with a thermobalance compensated for the variation of Archimedes' principle. Thus, the mass gain is measured continuously, at the temperature of the test. Note that the sample holders have been previously stabilized so that they do not react with the samples and do not oxidize.

Microstructure

Figure 8:
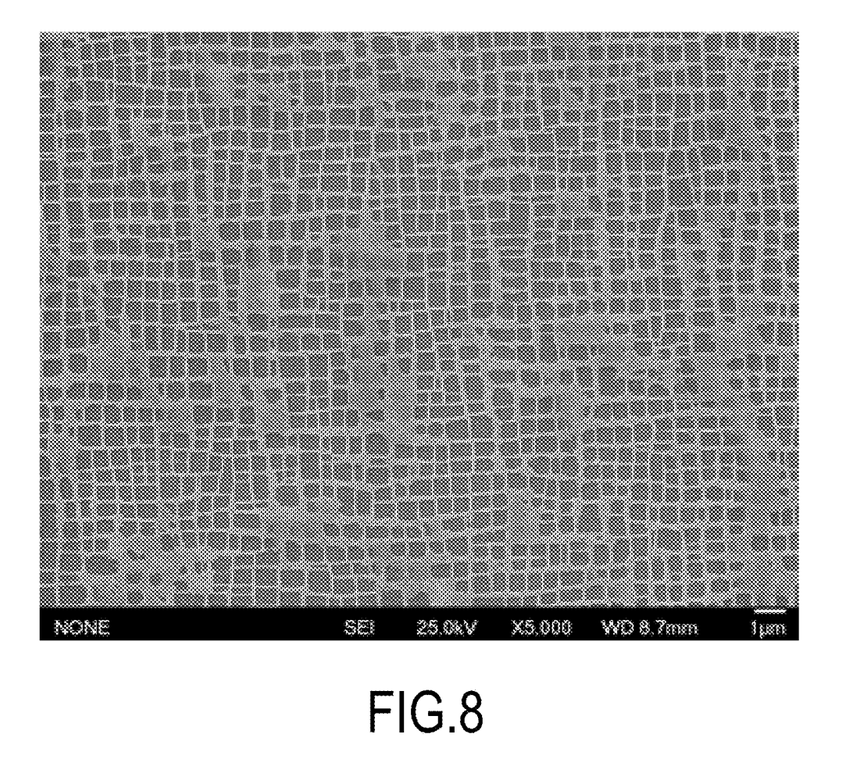
FIG. 8 is a micrograph representing the microstructure of a superalloy.

FIG. 8 shows a microstructure of superalloy Ex 5 after solution annealing and tempering by scanning electron microscopy at 5000× magnification. The microstructure shown is typical of an optimal microstructure for the mechanical properties of nickel-based superalloys, showing a microstructure with γ/γ' phases. In FIG. 8, the γ' precipitates are the dark gray cubes.

Although the present disclosure has been described with reference to a specific example of a specific embodiment, it is obvious that various modifications and changes can be made to these examples without going beyond the general scope of the invention as defined by the claims. Furthermore, individual features of the different embodiments referred to can be combined in additional embodiments. Therefore, the description and drawings should be considered in an illustrative rather than restrictive sense.

The invention claimed is:

1. A nickel-based superalloy comprising, in weight percent, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 4.30% platinum, 0 to 0.15% silicon, the remainder being nickel and unavoidable impurities.

2. The superalloy as claimed in claim 1, comprising, in percentages by mass, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 1.70 to 4.30% platinum, 0 to 0.15% silicon, the remainder being nickel and unavoidable impurities.

3. The superalloy as claimed in claim 1, comprising, in percentages by mass, 5.0 to 6.0% aluminum, 6.0 to 7.0% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 1.70 to 4.30% platinum, 0 to 0.15% silicon, the remainder being nickel and unavoidable impurities.

4. The superalloy as claimed in claim 1, comprising, in percentages by mass, 5.0 to 6.0% aluminum, 8.5 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 1.50% rhenium, 0.05 to 0.15% hafnium, 1.70 to 3.30% platinum, 0 to 0.15% silicon, the remainder being nickel and unavoidable impurities.

5. The superalloy as claimed in claim 1, comprising, in percentages by mass, 5.0 to 6.0% aluminum, 6.0 to 9.5% tantalum, 8.0 to 10.0% cobalt, 6.0 to 7.0% chromium, 0.30 to 0.90% molybdenum, 5.5 to 6.5% tungsten, 0.05 to 0.15% hafnium, 2.70 to 4.30% platinum, 0 to 0.15% silicon, the remainder being nickel and unavoidable impurities.

6. The superalloy as claimed in claim 1, comprising, in percentages by mass, 5.0 to 6.0% aluminum, 6.0 to 9.5% tantalum, 0.50 to 1.50% titanium, 8.0 to 10.0% cobalt, 6.0 to 7.0% chromium, 0.30 to 0.90% molybdenum, 5.5 to 6.5% tungsten, 0.05 to 0.15% hafnium, 2.70 to 4.30% platinum, 0 to 0.15% silicon, the remainder being nickel and unavoidable impurities.

7. The superalloy as claimed in claim 1, comprising, in percentages by mass, 5.0 to 6.0% aluminum, 6.0 to 9.5% tantalum, 0.80 to 1.20% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 3.30% platinum, 0 to 0.15% silicon, the remainder being nickel and unavoidable impurities.

8. The superalloy as claimed in claim 1, comprising, in percentages by mass, 5.0 to 6.0% aluminum, 6.0 to 9.5% tantalum, 0 to 1.50% titanium, 8.0 to 10.0% cobalt, 6.0 to 7.0% chromium, 0.30 to 0.90% molybdenum, 5.5 to 6.5% tungsten, 0 to 2.50% rhenium, 0.05 to 0.15% hafnium, 0.70 to 4.30% platinum, 0.10% silicon, the remainder being nickel and unavoidable impurities.

9. The superalloy as claimed in claim 1, comprising, in percentages by mass, 5.0 to 6.0% aluminum, 6.0 to 7.0% tantalum, 0.80 to 1.20% titanium, 8.0 to 10.0% cobalt, 6.0 to 7.0% chromium, 0.30 to 0.90% molybdenum, 5.5 to 6.5% tungsten, 0.05 to 0.15% hafnium, 2.70 to 3.30% platinum, 0 to 0.15% silicon, the remainder being nickel and unavoidable impurities.

10. The superalloy as claimed in claim 1, comprising, in percentages by mass, 5.0 to 6.0% aluminum, 6.0 to 7.0% tantalum, 0.80 to 1.20% titanium, 8.0 to 10.0% cobalt, 6.0 to 7.0% chromium, 0.30 to 0.90% molybdenum, 5.5 to 6.5% tungsten, 0.70 to 1.30% rhenium, 0.05 to 0.15% hafnium, 1.70 to 2.30% platinum, 0 to 0.15% silicon, the remainder being nickel and unavoidable impurities.

11. The superalloy as claimed in claim 1, comprising, in percentages by mass, 5.0 to 6.0% aluminum, 6.0 to 7.0% tantalum, 0.80 to 1.20% titanium, 8.0 to 10.0% cobalt, 6.0 to 7.0% chromium, 0.30 to 0.90% molybdenum, 5.5 to 6.5% tungsten, 1.70 to 2.30% rhenium, 0.05 to 0.15% hafnium, 0.70 to 1.30% platinum, 0 to 0.15% silicon, the remainder being nickel and unavoidable impurities.

12. The superalloy as claimed in claim 1, comprising, in percentages by mass, 5.0 to 6.0% aluminum, 6.0 to 7.0% tantalum, 8.0 to 10.0% cobalt, 6.0 to 7.0% chromium, 0.30 to 0.90% molybdenum, 5.5 to 6.5% tungsten, 0.05 to 0.15% hafnium, 3.70 to 4.30% platinum, 0 to 0.15% silicon, the remainder being nickel and unavoidable impurities.

13. The superalloy as claimed in claim 1, comprising, in percentages by mass, 5.0 to 6.0% aluminum, 8.5 to 9.5% tantalum, 0.80 to 1.20% titanium, 8.0 to 10.0% cobalt, 6.0 to 7.0% chromium, 0.30 to 0.90% molybdenum, 5.5 to 6.5% tungsten, 0.70 to 2.30% rhenium, 0.05 to 0.15% hafnium, 1.70 to 2.30% platinum, 0 to 0.15% silicon, the remainder being nickel and unavoidable impurities.

14. The superalloy as claimed in claim 1, comprising, in percentages by mass, 5.0 to 6.0% aluminum, 8.5 to 9.5% tantalum, 8.0 to 10.0% cobalt, 6.0 to 7.0% chromium, 0.30 to 0.90% molybdenum, 5.5 to 6.5% tungsten, 0.05 to 0.15% hafnium, 2.70 to 3.30% platinum, 0 to 0.15% silicon, the remainder being nickel and unavoidable impurities.

15. The superalloy as claimed in claim 1, comprising, in percentages by mass, 5.0 to 6.0% aluminum, 8.5 to 9.5% tantalum, 0.80 to 1.20% titanium, 8.0 to 10.0% cobalt, 6.0 to 7.0% chromium, 0.30 to 0.90% molybdenum, 5.5 to 6.5% tungsten, 0.05 to 0.15% hafnium, 2.70 to 3.30% platinum, 0.10% silicon, the remainder being nickel and unavoidable impurities.

16. A single-crystal blade for a turbomachine comprising a superalloy as claimed in claim 1.

17. The blade as claimed in claim 16, comprising a protective coating comprising a metallic bond coat deposited on the superalloy and a ceramic thermal barrier deposited on the metallic bond coat.

18. The blade as claimed in claim 16, having a structure oriented in a <001> crystallographic direction.

19. A turbomachine comprising a blade as claimed in claim 16.

* * * * *